Nov. 11, 1969 R. R. McLAREN 3,478,197

ELECTRONIC COUNTERS

Filed Sept. 20, 1966 2 Sheets-Sheet 1

Inventor
R. R. McLAREN
By Cameron, Kerkam & Sutton
Attorneys

Inventor
R. R. McLAREN
By Cameron, Kerkam & Sutton
Attorneys

United States Patent Office 3,478,197
Patented Nov. 11, 1969

3,478,197
ELECTRONIC COUNTERS

Ronald Robert McLaren, Edinburgh, Scotland, assignor to Ferranti, Limited, Hollinwood, Lancashire, England, a company of the United Kingdom of Great Britain and Northern Ireland Filed Sept. 20, 1966, Ser. No. 580,704
Claims priority, application Great Britain, Sept. 24, 1965, 40,842/65
Int. Cl. G06f *7/38;* G06g *7/00*
U.S. Cl. 235—92 10 Claims This invention relates to electronic counters of electrical pulses. The counters may be unidirectional or bidirectional, and may or may not be of ring formation.

An object of the invention is to provide such a counter which is especially suitable for thin-film constructions or other forms of miniaturisation.

Another object is to provide such a counter which consumes very little power.

In accordance with the present invention an electronic counter of electrical pulses includes for each power a base line common to all the digit stages of that power, and for each digit stage of the power a first and a second transistor of opposite conductivity types connected in series with their emitters commoned and their collectors connected to sources of appropriate relative polarity, the base of the first transistor being connected to the common base line, means for biasing the base of the second transistor in dependence on the conductivity condition of the first transistor, the circuit parameters being such that in operation the stage is either in an ON state in which both transistors are conducting or in an OFF state in which both are non-conducting, and a switching input point so located that the application of a pulse to that input point when the stage is in its OFF state switches the stage to its ON state, the circuit parameters being also such that the transient effect of the pulse on the common base line is to switch to its OFF state any stage previously ON, and for at least one digit stage of the counter response means for actuation when that stage is in its ON state.

Figure 1:
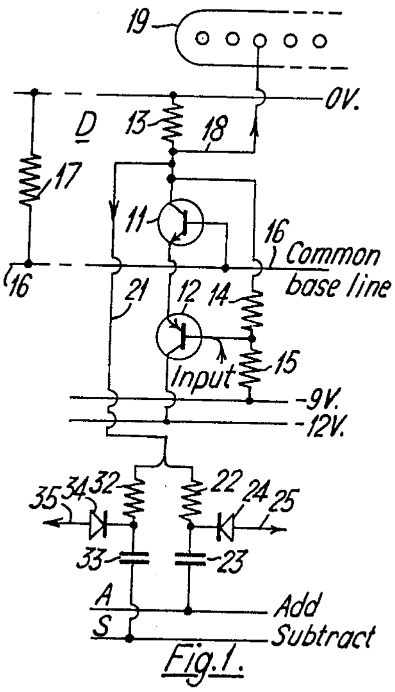
Figure 3:
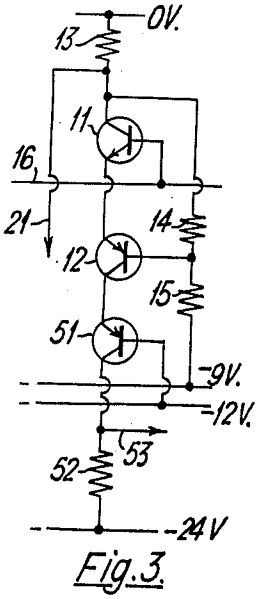
Figure 5:
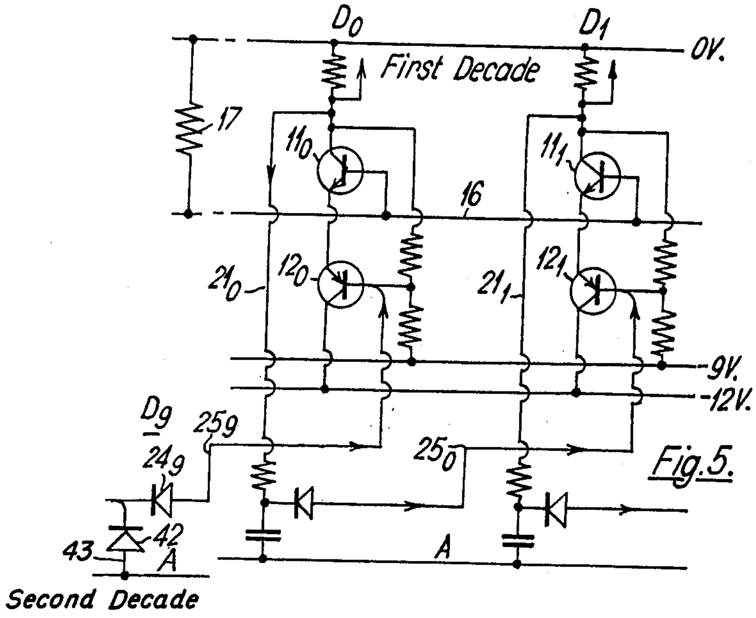
Figure 2:
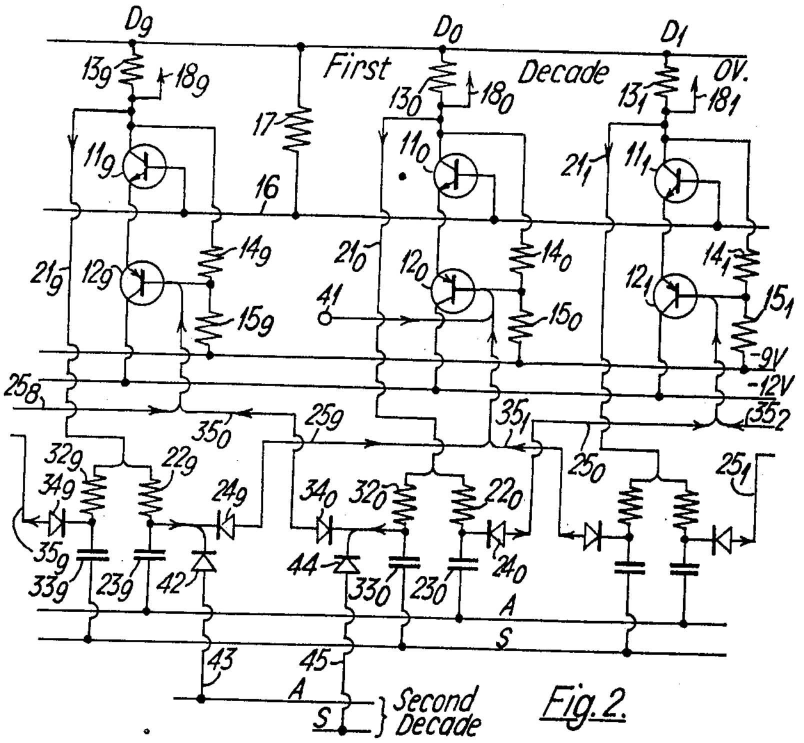
Figure 4:
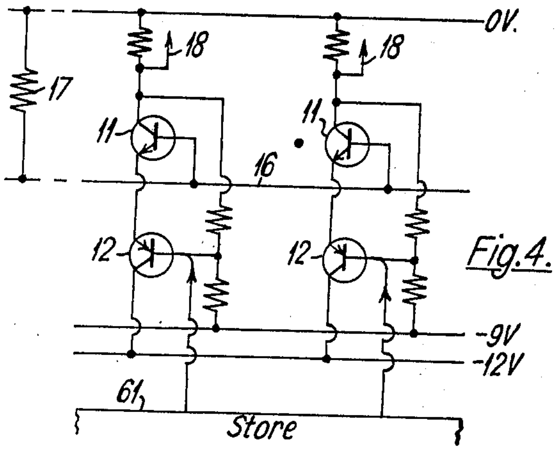

Embodiments of the invention will now be described with reference to the accompanying drawings in which FIGURE 1 is a circuit diagram of a digit stage of one decade (power) ring of a multi-decade bidirectional decimal ring counter in accordance with one embodiment, FIGURE 2 shows a group of adjacent stages as in FIGURE 1 to indicate the inter-stage and inter-decade transfer arrangements, FIGURE 3 shows a part of the stage of FIGURE 1 in accordance with another embodiment, FIGURE 4 shows the counter as used for recording the number of pulses held in a computer store, and FIGURE 5 is a circuit diagram similar to a part of FIGURE 2 but for unidirectional counting.

The single digit stage D of FIGURE 1 includes first and second transistors 11 and 12 of opposite conductivity types NPN and PNP connected in series, with their emitter electrodes commoned, between sources which have appropriate relative polarity. Thus the collector electrode of transistor 11 is connected (by way of a load resistor 13) to a source more positive than that to which the collector of transistor 12 is connected. Suitable potential values for the sources are 0 and −12 volts respectively.

The base electrode of transistor 12 is connected to the common point of resistors 14 and 15 which form with resistor 13 a potentiometer chain between the 0 volt supply source and a bias source of −9 volts. In this way the base of transistor 12 is biased in dependence on the conductivity condition of transistor 11.

The base of transistor 11 is connected to a base bias line 16 which is common to all the stages of the decade and which is connected to the 0 volt source by a resistor 17. The collector of this transistor is additionally connected over a lead 18 to an indicator tube 19 or other display device.

Also common to the ring are Add and Subtract input channels A and S, over the appropriate one of which each pulse to be counted is applied. With the supply sources having the potential values stated, each of these channels is held at −12 volts in the absence of a pulse, and is driven by a pulse down to −18 volts for the pulse duration.

To control the application of the pulses to the two adjacent stages for inter-stage transfer purposes, stage D includes transfer means in the form of two transfer networks leading to those stages from channels A and S respectively and controlled by stage D over a control connection in the form of a lead 21 from the collector of its transistor 11.

Thus for pulses to be added, and therefore received over channel A, lead 21 is connected to that channel by way of the appropriate transfer network; this includes a resistor 22 and a capacitive component, in the form of a capacitor 23, in series, the common point of which is connected by way of a diode 24, poled to pass negative-going pulses, to a switching lead 25.

For pulses to be subtracted, lead 21 is connected to channel S by way of the other transfer network consisting of a resistor 32 and a capacitor 33, the common point of which components is connected by way of diode 34, also poled to pass negative-going pulses, to a switching lead 35.

Leads 25 and 35 are connected to the switching input points of the two adjacent stages, that is, those next above and next below, respectively; but before these transfer connections are described in detail, the manner in which the stage operates will be broadly indicated.

The circuit parameters—for example, the values of the supply voltages, the characteristics of the transistors—are such that in operation the transistors are either both conducting or both non-conducting. The stage holds a digit when both transistors are conducting. The output over lead 18 provides an indication of this in the form of a glow discharge in tube 19, which additionally indicates the particular digit which the stage represents. The stage is switched to this conducting state from its non-conducting state by a negative-going pulse applied to the base of transistor 12, which electrode serves as the switching input point. The circuit parameters are such that as a transient effect during the switching process the common base line 16 is driven negatively enough to switch to its non-conducting state any stage that was previously conducting. At the end of the transient phase, therefore, there is only the on-coming stage which is conducting. Thus the two transistors of the stage, though not forming by themselves a bistable combination, operate in effect as one by reason of the common base lead.

For brevity, the two stable states of the stage when both transistors are conducting and both non-conducting will more usually be referred to hereinafter as its ON state and OFF state respectively, or, more simply "on" and "off."

The control of the transfer networks exercised by the stage over lead 21 is such that the charge condition of the capacitors 23 and 33 is dependent on the conductive state of the stage. Thus when the stage is in its OFF state with transistor 11 on-conducting, the stage holds the capacitors charged. The charge in capacitor 23 so biases diode 24 in the non-conductive sense as to prevent an input pulse from channel A from passing the diode to reach the switching input point of the next higher stage. The charge in capacitor 33 similarly applies an inhibiting bias to block the switching path from channel S to the next lower stage.

When on the other hand the stage is in its ON state with transistor 11 bottomed, both capacitors are sufficiently discharged to remove these inhibiting biases from the diodes, thereby unblocking the switching paths to the next stages and so allowing the appropriate one of them to be switched by the next input pulse.

The transfer connection between stages and the carry arrangements between adjacent powers—that is, decade rings—will be readily appreciated from FIGURE 2, which shows the adjacent digit stages $D_9$, and $D_0$, and $D_1$, representing digits 9, 0, and 1, of the lowest or first decade of the counter. The components of each stage are as just described with reference to FIGURE 1 and are therefore indicated by the same reference numerals, with suffixes 9, 0, or 1, as the case may be.

For inter-stage transfer the output leads $\mathbf{25}_0$ and $\mathbf{35}_0$ from the transfer networks of stage $D_0$ are connected to the bases of transistors $\mathbf{12}_1$ and $\mathbf{12}_9$ of adjacent stages $D_1$ and $D_9$ to supply the switching inputs to them. Similarly, output leads $\mathbf{25}_9$ and $\mathbf{35}_1$ from stages $D_9$ and $D_1$ are both connected to the base of transistor $\mathbf{12}_0$. The remaining stage transfer inter-connections are on similar lines and need not be described. A feature, provided for stage $D_0$ only, is a connection from the base of its transistor $\mathbf{12}_0$ to a Reset terminal 41.

As already mentioned, the base lead 16 and channels A and S are common to all the stages of the ring. Arrangements (not shown) are made so that each input pulse to the counter is made to drive, to the negative extent described, the channel A or S according to whether the pulse is to be added or subtracted.

In operation, it will be assumed to begin with that stage $D_0$ is ON—that is, in its conducting stable state—so that the ring holds digit 0. Transistor $\mathbf{11}_0$ is held conducting by drawing base current through resistor 17 by way of the common base bias line 16, whilst transistor $\mathbf{12}_0$ is held conducting because of the low potential applied to its base from the common point of resistors 15 and 16 with transistor $\mathbf{11}_0$ bottomed.

In each of the other stages of the ring the base potential of its transistor 12, as the result of transistor 11 being non-conducting, holds transistor 12 also non-conducting. Thus each stage is in its OFF state.

With transistor $\mathbf{11}_0$ bottomed, each of capacitors $\mathbf{23}_0$ and $\mathbf{33}_0$ is in its almost fully discharged condition, with the inhibiting biases removed from diodes $\mathbf{24}_0$ and $\mathbf{34}_0$ and so leaving unblocked the switching paths to the adjacent stages. In each of the other stages the capcaitors are charged, thereby blocking the switching paths to the adjacent stages.

Assume now that a pulse to be added is received, thereby driving channel A from −12 to −18 volts. The only switching path connected to this channel which is not blocked at the diode is that to stage $D_1$. The pulse accordingly passes to the base of transistor $\mathbf{12}_1$ by way of capacitor $\mathbf{23}_0$, diode $\mathbf{24}_0$, and output lead $\mathbf{25}_0$ of the transfer network of stage $D_0$. The effect of driving the base negatively is to drive in that sense the commoned emitters of transistors $\mathbf{11}_1$ and $\mathbf{12}_1$. The pulse also drives negatively the common base line 16, to an extent sufficient to switch off stage $D_0$, without however preventing the switching on of stage $D_1$. At the end of the pulse both transistors $\mathbf{11}_1$ and $\mathbf{12}_1$, and hence stage $D_1$ as a whole, are switched on, and the base line has returned to its previous steady level of potential.

In each of the other stages the inhibiting bias on the diode in each of the two switching leads to the stage has prevented the pulse from reaching its transistor 12 and so switching the stage on.

The switching off of stage $D_0$ causes its capacitors $\mathbf{23}_0$ and $\mathbf{33}_0$ to become charged and so blocking the switching paths to stages $D_9$ and $D_1$. On the other hand the now discharged capacitors of stage $D_1$ have unblocked the switching paths to the adjacent stages, to enable the next input pulse to switch on stage $D_2$ or stage $D_0$ (in each case switching off stage $D_1$) according to whether the pulse arrives for addition over channel A or for subtraction over channel S.

Where a pulse arrives for subtraction, over channel S, the operation is similar, except that the stage is switched on is the adjacent lower stage, rather than the adjacent higher one.

The value of each of resistors 22 and 32 in the transfer networks of a stage is chosen to be such that when the stage is ON and in consequence the switching paths from it to the adjacent stages are unblocked, the steady-state current which passes through each resistor and the associated diode to the base of transistor 12 of the adjacent stage is insufficient to switch that stage on.

The switching input point of a stage may alternatively be the commoned emitters. The effect of a pulse is to switch on transistor 11, the collector current of which is drawn from the pulse; the consequent bottoming of that transistor drops the potential of the common point of resistors 13 and 14 sufficiently for transistor 12 to be switched on also. Or the switching input point may be the collector of transistor 11, thereby anticipating its bottoming and so switching transistor 12 on first.

To reset the ring to zero, a negative-going pulse is applied to terminal 41. This switches on the zero digit stage $D_0$ (assuming it was not already on) and switches off, in the manner described above, the stage previously on, wherever that stage happens to be in the ring.

Carries between adjacent powers (decades) may be effected as follows.

Each decade is exactly as described above, except that the input pulses are applied directly to the A and S channels of only the lowest decade. In each higher decade, channel A is connected for pulse-energisation to the Add output point of the transfer network leading to the digit 0 stage of the next lower decade. Thus where the higher decade is the second, the connection to its Add channel is from the common point of components $\mathbf{22}_9$ and $\mathbf{23}_9$ of stage $D_9$ of the first decade—see FIGURE 2—by way of a diode 42, poled similarly to diode $\mathbf{24}_9$, and a lead 43. Thus when the first decade receives a pulse to be added whilst the decade holds digit 9, that pulse is passed not only over lead $\mathbf{25}_9$ to stage $D_0$ of the first decade but also over lead 43 to the Add channel of the second decade, and hence to the digit stage of that decade which is appropriate to being switched on to record the carry.

Similarly, the transfer connection to the Subtract channel of the second decade is taken from the common point of components $\mathbf{32}_0$ and $\mathbf{33}_0$ of digit stage $D_0$ of the first decade by way of a diode 44 and lead 45. Thus the Subtract channel of the second decade receives a pulse whenever the first decade receives one for subtraction whilst it holds digit 0.

Where required, a buffer output stage may be introduced between each digit stage and the corresponding display means. In FIGURE 3, the stage of FIGURE 1 is shown thus modified; as the transfer networks are the same as before, they are not shown again. The collector of transistor 12 is connected to the −12 volts source by way of the emitter and base of a second PNP transistor 51 the collector of which is connected by way of a resistor 52 to a source of still more negative potential—say, −24 volts. The output lead 53 to the display is connected to the collector of this additional transistor 51. In this arrangement the display signal is a signal that is positive-going, rather than negative-going as in the arrangement of FIGURE 1.

Either of the above-described embodiments may be modified by replacing each transistor by one of the opposite conductivity type, provided that the polarities of the supply and of all the transfer diodes are reversed also. The pulses to be counted are now required to be positive-going, and each display signal is positive-going in the arrangement of FIGURE 1 and negative-going in that of FIGURE 3.

It is not always necessary to provide a response means for each digit stage. Where for example the counter is required to supply an output only when the count has reached a predetermined value, response means need only be provided for the digit stages of the respective powers that represent that particular number.

A counter in accordance with the invention has the particular advantage of lending itself to miniature construction of the kind in which the resistive and capacitive components fare formed by thin metallic films on a substrate, since the fewness of those components required by the circuit allows the substrate to be of especially small area. A related advantage is the low current consumption, arising from the fact that no current is drawn by the OFF stages, whilst the single ON stage of each decade is only required to provide the small current necessary to maintain the glow of the display tube or other display device.

The effectively bistable nature of each stage allows a group of the to be used as a counter or output register for a digital store. Two such stages are shown in FIGURE 4, with the store itself (which forms no part of the present invention) indicated generally at 61. The stages are similar to those of FIGURES 1 and 2 including the common base line 16 but with the transfer networks and input channels omitted. Each digital "bit" to be added is applied as a trigger pulse to the base of transistor 12 (or other input point) of the stage required to store it, and the common base line ensures the removal of the bit previously stored by switching off the stage previously ON.

Where the counter is unidirectional, the circuit may be as described above with reference to FIGURE 2 but modified in that the pulses are received over only one channel and the unwanted transfer networks are omitted. Thus where the single channel is the Add channel A, as shown in FIGURE 5 for stages $D_0$ and $D_1$, components 32 to 35 of each network are omitted, together with the Subtract carry connection to the second decade.

The invention is also applicable where the counter, whether bidirectional or monodirectional, is not of ring formation. In such an arrangement, no carry is provided from the digit 9 stage of a power back to digit 0; hence the transfer network controlled by each digit 9 stage is provided only to supply a carry pulse to the next higher power.

Instead of a display device of the kind described, the response means may take the form of some sort of printer, or some device for performing a switching operation.

It will be appreciated that in the above descriptions, the terms "lower" and "higher," or "below" and "above," when applied to the digit stages of a ring counter, should be interpreted in recollection of the fact that the digit 9 and 0 stages are adjacent. Thus for example the stage next "above" the digit 9 stage is the digit 0 stage; similarly when referring to the digit 0 stage, the next "lower stage is the digit 9 stage.

What we claim is:

1. An electric counter of electrical pulses including for each power a base line common to all the digit stages of that power, and for each digit stage of the power a first and a second transistor of opposite conductivity types connected in series with their emitters commoned and their collectors connected to sources of appropriate relative polarity, the base of the first transistor being connected to the common base line, means for biasing the base of the second transistor in dependence on the conductivity condition of the first transistor, the circuit parameters being such that in operation the stage is either in an ON state in which both transistors are conducting or in an OFF state in which both are non-conducting, and a switching input point so located that the application of a pulse to that input point when the stage is in its OFF stage switches the stage to its ON state, the circuit parameters being also such that the transient effect of the pulse on the common base line is to switch to its OFF state any stage previously ON, and for at least one digit stage of the counter response means for actuation when that stage is in its ON state.

2. A counter as claimed in claim 1 which further includes for each power at least one input channel common to all the digit stages of that power and for control by each digit stage of the power a transfer network for each input channel, the network leading from that channel to a stage adjacent to the controlling stage in a desired direction of counting, and a control connection from the controlling stage to the network, that connection being taken from such a point on the controlling stage and the network being so arranged that when and only when the controlling stage is in its ON state the nework is conditioned to allow each pulse which arrives over the associated input channel to pass to the switching input point of said adjacent stage to switch that adjacent stage to its ON state.

3. A counter as claimed in claim 2 of ring formation for bi-directional counting wherein for each power there are two such input channels, for pulses to be added and pulses to be subtracted respectively, and for each stage two of said transfer networks leading respectively from those channels to the input points of the appropriate ones of the two stages adjacent to the controlling stage.

4. A counter as claimed in claim 2 for bi-directional counting but not of ring formation wherein there are two such input channels, for pulses to be added and pulses to be subtracted respectively, for each of the lowest and the highest stages one of said transfer networks leading from the appropriate one of said channels to the input point of the stage next above and the stage next below the controlling stage respectively, and for each of the other stages two of said transfer networks leading respectively from those channels to the input points of the appropriate ones of the two stages adjacent to the controlling stage.

5. A counter as claimed in claim 2 of ring formation for unidirectional counting wherein there is one such input channel and for each stage of each power one of said transfer networks leading from the channel to the input point of the stage adjacent to the controlling stage in the direction of counting.

6. A counter as claimed in claim 2 wherein each of said network includes a capacitive component, the said control connection to the nework being such that the charge condition of the component is so dependent on the state of the controlling stage as to block or unblock the switching path of an input pulse to the associated adjacent stage according as the controlling stage is in its OFF or ON state respectively.

7. A counter as claimed in claim 3 which includes more than one power wherein the carry connections between powers are taken from the networks which are controlled by the highest and the lowest digit stages of the lower power and which lead to the lowest and the highest stages thereof respectively, those connections being applied to the appropriate ones of the two input channels of the higher power.

8. A counter as claimed in claim 5 which includes more than one power wherein the carry connection between powers is taken from the transfer network which is controlled by the highest digit stage of the lower power and which leads to the lowest stage thereof, the connection being applied to the input channel of the highest power.

9. A counter as claimed in claim 1 wherein the response means of a stage includes a buffer amplifier, a driving connection from the second transistor of the stage to that amplifier, and a display device in the output circuit of the amplifier.

10. A counter as claimed in claim 1 wherein the switching input point of each stage is constituted by any one of the following electrodes, namely, the base of the second transistor, the commoned emitters, and the collector of the first transistor.

References Cited

UNITED STATES PATENTS

| | | | |
|---|---|---|---|
| 3,079,513 | 2/1963 | Yokelson | 307—88.5 |
| 3,225,215 | 12/1965 | Winter | 307—88.5 |
| 3,227,314 | 10/1966 | Munoz | 307—88.5 |

MAYNARD R. WILBUR, Primary Examiner

J. M. THESZ, Assistant Examiner

U.S. Cl. X.R.

307—224, 228